(12) United States Patent
Jung et al.

(10) Patent No.: US 11,152,650 B2
(45) Date of Patent: Oct. 19, 2021

(54) SECONDARY BATTERY SAFETY EVALUATION METHOD AND DEVICE

(71) Applicant: LG CHEM, LTD., Seoul (KR)

(72) Inventors: Bum-Young Jung, Daejeon (KR); Hee-Min Kim, Daejeon (KR)

(73) Assignee: LG Chem, Ltd., Seoul (KR)

(*) Notice: Subject to any disclaimer, the term of this patent is extended or adjusted under 35 U.S.C. 154(b) by 139 days.

(21) Appl. No.: 16/621,227

(22) PCT Filed: Dec. 26, 2018

(86) PCT No.: PCT/KR2018/016687
§ 371 (c)(1),
(2) Date: Dec. 10, 2019

(87) PCT Pub. No.: WO2019/151654
PCT Pub. Date: Aug. 8, 2019

(65) Prior Publication Data
US 2020/0166580 A1   May 28, 2020

(30) Foreign Application Priority Data
Jan. 31, 2018 (KR) .................. 10-2018-0011898

(51) Int. Cl.
*G01R 31/00* (2006.01)
*H01M 10/42* (2006.01)
(Continued)

(52) U.S. Cl.
CPC ...... *H01M 10/4285* (2013.01); *G01R 31/389* (2019.01); *G01R 31/52* (2020.01)

(58) Field of Classification Search
USPC .................. 324/426–435, 459, 714–719
See application file for complete search history.

(56) References Cited

U.S. PATENT DOCUMENTS

2001/0019270 A1* 9/2001 Onishi .............. H01M 10/48
324/426
2005/0253591 A1   11/2005 Kasamatsu et al.
(Continued)

FOREIGN PATENT DOCUMENTS

CN    1996028 A    7/2007
CN    10553950 A   10/2009
(Continued)

OTHER PUBLICATIONS

Extended Search Report issued from the European Patent Office dated Oct. 30, 2020 in a corresponding European Patent Application No. 18903117.2.
(Continued)

*Primary Examiner* — Vincent Q Nguyen
(74) *Attorney, Agent, or Firm* — Morgan, Lewis & Bockius LLP

(57) ABSTRACT

A safety evaluation method according to the present disclosure includes preparing a sample for secondary battery electrode evaluation in which a short circuit will occur by contact between components included in the sample, applying a predetermined pressure that will cause the contact between the components to an area of the sample set as a secondary battery internal short circuit simulation contact area, applying a current between I probes in contact with the sample, obtaining resistance by measuring a potential difference between V probes which are separate from the I probes, obtaining a graph of a change in resistance with a change in distance between the V probes, calculating a short circuit resistance of the area from y-intercept of the graph, and predicting a heat generation amount of the area from the short circuit resistance.

7 Claims, 13 Drawing Sheets

(51) Int. Cl.
*G01R 31/389* (2019.01)
*G01R 31/52* (2020.01)

(56) References Cited

U.S. PATENT DOCUMENTS

| | | |
|---|---|---|
| 2008/0143337 A1 | 6/2008 | Fujikawa et al. |
| 2008/0186029 A1 | 8/2008 | Nishino et al. |
| 2009/0286148 A1 | 11/2009 | Fujikawa et al. |
| 2010/0209767 A1 | 8/2010 | Kasamatsu et al. |
| 2011/0068800 A1 | 3/2011 | Nishino et al. |
| 2012/0176140 A1 | 7/2012 | Kitsuani et al. |
| 2012/0321976 A1 | 12/2012 | Kumei et al. |
| 2013/0127473 A1 | 5/2013 | Ikeda |
| 2013/0344398 A1 | 12/2013 | Kim et al. |
| 2014/0183770 A1 | 7/2014 | Ziegler et al. |
| 2016/0380301 A1* | 12/2016 | Kosaka ............ H01M 10/0525 156/306.6 |
| 2017/0179538 A1 | 6/2017 | Christensen et al. |
| 2018/0074131 A1 | 3/2018 | Lim et al. |

FOREIGN PATENT DOCUMENTS

| | | |
|---|---|---|
| CN | 102097652 A | 6/2011 |
| CN | 102148399 A | 8/2011 |
| CN | 103091537 A | 5/2013 |
| CN | 104919090 A | 9/2015 |
| CN | 10845595 A | 8/2016 |
| EP | 2755274 A1 | 7/2014 |
| EP | 3343238 A1 | 7/2018 |
| JP | 2011-085415 A | 4/2011 |
| JP | 2015-227841 A | 12/2015 |
| KR | 10-2006-0047689 A | 5/2006 |
| KR | 10-2008-0073667 A | 8/2008 |
| KR | 10-0902316 B1 | 6/2009 |
| KR | 10-2009-0130412 A | 12/2009 |
| KR | 1020110021970 A | 3/2011 |
| KR | 10-2012-0068919 A | 6/2012 |
| KR | 1020120085322 A | 7/2012 |
| KR | 10-1410166 B1 | 6/2014 |
| KR | 10-2016-0051044 A | 5/2016 |
| KR | 10-1705738 B1 | 2/2017 |
| KR | 10-2017-0030356 A | 3/2017 |
| KR | 10-2017-0078365 A | 7/2017 |
| WO | 2017/185311 A1 | 11/2017 |

OTHER PUBLICATIONS

International Search Report issued in corresponding International Patent Application No. PCT/KR2018/016687, dated Apr. 18, 2019.

* cited by examiner

SECONDARY BATTERY SAFETY EVALUATION METHOD AND DEVICE

TECHNICAL FIELD

The present disclosure relates to a method and apparatus for evaluating safety of a secondary battery, and more particularly, to a safety evaluation method and apparatus that can be used in the secondary battery design step. The present application claims priority to Korean Patent Application No. 10-2018-0011898 filed in the Republic of Korea on Jan. 31, 2018, the disclosure of which is incorporated herein by reference.

BACKGROUND ART

With the technology development and the increasing demand for mobile devices, electric vehicles, hybrid electric vehicles, power storage systems and uninterruptible power systems, the demand for secondary batteries as an energy source is dramatically increasing, and to meet various needs, many studies about secondary batteries are being made.

One of main challenges of secondary batteries is to increase the performance of secondary batteries through energy density improvements, as well as improve the safety of secondary batteries. In particular, lithium secondary batteries have risks of fires and explosions according to the characteristics of materials used, and in some instances, safety related accidents occur. When electrolyte decomposition reactions and thermal runaway occur in lithium secondary batteries due to heat generation caused by internal short circuits, overcharge and overdischarge, the internal pressure of the batteries sharply increases, causing battery explosions.

In particular, internal short circuits of lithium secondary batteries may occur due to external impacts applied to the batteries. In this instance, the short circuited positive and negative electrodes have higher risks of explosions than other safety related accidents such as overcharge or overdischarge due to rapid conduction of high electrical energy stored in each electrode. Explosions give serious damage to not only secondary batteries but also users, so secondary battery designers need to develop secondary battery design technology in various aspects to ensure safety from explosion phenomena caused by short circuits.

To improve the performance of secondary batteries, it is necessary to increase an amount of energy inside, but potential accident risks increase as much, and accordingly, it is necessary to evaluate battery performance and safety in accordance with suitable test standards. Secondary batteries produced in mass using new design technology are tested for safety to evaluate how well the batteries are designed to prevent explosion caused by internal short circuits. The secondary battery safety items include a compression test that simulates an internal short circuit occurring in the battery by the external pressure, a collision test that simulates explosion and fire caused by an internal short circuit of the battery when impacted by a rod, a penetration test that simulates an internal short circuit occurring due to nail penetration into the battery during the packaging delivery of the battery similar to the collision test, and a heat exposure (heating) test for evaluating the capability of the battery to withstand the exposed temperature environment of abnormally increased surrounding temperature.

However, these tests are aimed at evaluating safety after battery assembly, and there is a lack of pre-evaluation methods for evaluating safety in the battery design step before battery assembly and the electrode assembly step using new design technology. Currently, safety evaluation in the electrode assembly step involves predicting resistance (hereinafter, short circuit resistance) of a short circuited area based on resistance values of each component of a unit cell and simulating a heat generation amount to prevent internal short circuits from occurring in the secondary battery.

FIG. 1 is a diagram illustrating the internal structure of a cell and the type of short circuit.

Referring to FIG. 1, the cell may have four types of internal short circuits: a short circuit $S_A$ between a positive electrode current collector 10 and a negative electrode current collector 20, a short circuit $S_B$ between the positive electrode current collector 10 and a negative electrode active material layer 22, a short circuit $S_C$ between a positive electrode active material layer 12 and the negative electrode active material layer 22, and a short circuit $S_D$ between the positive electrode active material layer 12 and the negative electrode current collector 20.

It is possible to evaluate safety by predicting a heat generation amount from short circuit resistance for each type of short circuit $S_A$, $S_B$, $S_C$, $S_D$. However, in many cases, each short circuit resistance value currently used in simulation is simply an addition of known unique resistance values of materials. In practice, contact resistance that may change depending on electrode composition (ratios of an active material, a conducting material and a binder, etc.), electrode design (porosity, thickness, etc.) and electrode surface characteristics is not considered. The short circuit resistance is measured and used by checking voltage while applying the current with two terminals contacting the short circuited region, but this is a roughly measured value and thus is insufficient for accurate simulation. In addition, the measurement method does not consider the pressure affecting the contact resistance. There has been no means of accurately measuring the short circuit resistance exactly reflecting the contact resistance under consideration of the pressure.

The contact resistance is a third resistance component occurring on the contact surface. FIG. 2 is a diagram illustrating the definition and cause of the contact resistance.

Referring to FIG. 2, for example, when a material AA and a material BB are connected in series in contact with each other to form a contact surface C, the measured resistance $R_{SUM}$ is higher than the sum of respective resistances $R_{AA}$ and $R_{BB}$ of each material. That is, a resistance component $R_C$ of the contact surface C is generated, and $R_{SUM} = R_{AA} + R_{BB} + R_C$. As described above, a new resistance component is generated by the limited movement channel of electrons e⁻ on the contact surface, and resistance resulting from the limited electron movement channel on the contact surface is defined as contact resistance. Accordingly, in the short circuits of FIG. 1, for example, when predicting the short circuit resistance of the short circuit $S_A$ region, the sum of resistance of the positive electrode current collector 10 and resistance of the negative electrode current collector 20, as well as the contact resistance of the contact surface between the positive electrode current collector 10 and the negative electrode current collector 20 should be considered for accurate prediction.

However, it is difficult to accurately measure the contact resistance by the reason as shown in FIG. 3.

First, seeing (a) and (b) of FIG. 3, there is an electron movement channel difference according to the surface condition of the contact surface between the material AA and the material BB, causing a resistance change. The surface condition of the contact surface of (a) has a less electron movement channel. Accordingly, high resistance occurs on the contact surface. In contrast, the surface condition of the contact surface of (b) has many electron movement channels. Accordingly, low resistance occurs on the contact surface.

Additionally, as shown in (c) and (d) of FIG. 3, there is an electron movement channel difference according to the magnitude of a force F acting on the contact surface, causing a resistance change. When a weak force acts as shown in (c), there is a less electron movement channel. Accordingly, high resistance occurs on the contact surface. In contrast, when a strong force acts as shown in (d), there are many electron movement channels. Accordingly, low resistance occurs on the contact surface.

To accurately evaluate safety of a secondary battery, it is necessary to know an accurate short circuit resistance, taking into account the contact resistance between components that have caused a short circuit. However, many surrounding factors affecting the resistance value such as the surface condition of the contact surface or the force acting on the contact surface (in the end, the pressure), etc. make it difficult to accurately measure the short circuit resistance and reduce the accuracy of the safety evaluation method.

DISCLOSURE

Technical Problem

The present disclosure is designed to solve the above-described problem, and therefore the present disclosure is directed to providing a method that evaluates safety of a secondary battery more accurately by accurately measuring the short circuit resistance including the contact resistance between short circuit components at the time of an internal short circuit of the secondary battery.

The present disclosure is further directed to providing a safety evaluation apparatus suitable for implementing the safety evaluation method.

Other objects and advantages of the present disclosure will be understood by the following detailed description, and they will be apparent from the embodiments of the present disclosure. Additionally, it will be easily seen that the objects and advantages of the present disclosure may be realized by the means set forth in the appended claims and combinations thereof.

Technical Solution

To achieve the above-described object, a safety evaluation method according to the present disclosure includes preparing a sample for secondary battery electrode evaluation in which a short circuit will occur by contact between components included in the sample, applying a predetermined pressure that will cause the contact between the components to an area of the sample set as a secondary battery internal short circuit simulation contact area, applying a current between I probes in contact with the sample, obtaining resistance by measuring a potential difference between V probes which are separate from the I probes, obtaining a graph of a change in resistance with a change in distance between the V probes, calculating a short circuit resistance of the area from y-intercept of the graph, and predicting a heat generation amount of the area from the short circuit resistance.

The safety evaluation method according to the present disclosure may further include determining if at least one item of composition, porosity, thickness and surface characteristic of the component is suitable from a predicted result value of the heat generation amount.

The safety evaluation method according to the present disclosure may further include obtaining a graph of a change in short circuit resistance with a change in pressure, and performing a simulation of short circuit resistance with a change in internal pressure of a secondary battery including the components.

To achieve another object, a safety evaluation apparatus according to the present disclosure includes a jig unit for measuring a short circuit resistance and a system unit for measurement and calculation, wherein the jig unit includes a mount on which a sample for secondary battery electrode evaluation is placed, the sample for secondary battery electrode evaluation in which a short circuit will occur by contact between components included in the sample, a pressure applying unit provided to apply a predetermined pressure that will cause the contact between the components to an area of the sample set as a secondary battery internal short circuit simulation contact area, and I probes provided to come into contact with the sample and V probes which are separate from the I probes and have an adjustable distance between the probes, and the system unit includes a measuring and recording unit to apply a current between the I probes and measure and record a potential difference between the V probes, a control unit, and a calculation unit to obtain a graph of a change in resistance with a change in distance between the V probes, calculate a short circuit resistance of the area from y-intercept of the graph, and predict a heat generation amount of the area from the short circuit resistance.

The V probes may include a plurality of V probes arranged at a regular interval, and any two of the V probes may be selected and used in combination to change the distance between the V probes.

The pressure applying unit may include a press unit, a load cell and an indicator. Here, the press unit may include an up-down press which operates by a driving unit and a press jig which can be replaced with another press jig of a right size for the area.

The system unit may include electrochemical impedance spectroscopy (EIS).

Advantageous Effects

The safety evaluation method of the present disclosure accurately measures the short circuit resistance used as one of safety evaluation items in the battery design step before battery assembly and the electrode assembly step, where the short circuit resistance including the contact resistance between components that have caused a short circuit is measured for accurate measurement.

According to the safety evaluation method of the present disclosure, the short circuit resistance may be accurately measured by simulation of an internal short circuit situation of the secondary battery, a heat generation amount at the time of internal short circuit may be predicted, and through this, substantial safety evaluation for the active material and the composition of the electrode and the battery design may be performed as pre-evaluation before battery assembly. When safety evaluation is finished before battery assembly, it is possible to verify and modify new design standards. It is possible to immediately change the design condition of the secondary battery after evaluation, and can be used as an evaluation means useful in the research and development stage. Accordingly, the safety evaluation method of the present disclosure is pre-evaluation, not post-evaluation such as compression test, collision test, penetration test and heat exposure (heating) test, and can provide very accurate and useful safety evaluation means.

According to the safety evaluation method of the present disclosure, it is possible to evaluate safety using the sample for secondary battery electrode evaluation including a combination of any one of the positive electrode current collector and the positive electrode active material layer and any one of the negative electrode current collector and the negative electrode active material layer. As opposed to the conventional post-evaluation method, there is no need to prepare a complete secondary battery sample, reducing the evaluation costs and the final secondary battery manufacturing costs accordingly.

According to the safety evaluation apparatus of the present disclosure, it is possible to achieve precise measurement by separately using I probes for applying the current and V probes for measuring a potential difference, and measure an accurate short circuit resistance by obtaining a graph of a change in resistance with a change in distance between V probes and eliminating the resistance component of the probe wire.

Additionally, according to the safety evaluation apparatus of the present disclosure, the pressure applying unit including the load cell and the indicator is provided to measure the short circuit resistance by applying, to the sample, a specific pressure that is equal to the pressure at the time of the real internal short circuit of the secondary battery. Accordingly, it can be used as safety evaluation means under a more accurate and realistic internal short circuit simulation environment.

According to the safety evaluation apparatus of the present disclosure, it is possible to measure the pressure and the short circuit resistance and predict a heat generation amount at the same time using one apparatus, thereby enhancing the time efficiency and improving the test operation efficiency.

BRIEF DESCRIPTION OF DRAWINGS

The accompanying drawings illustrate preferred embodiments of the present disclosure, and together with the following detailed description, serve to provide a further understanding of the technical aspects of the present disclosure, and thus, the present disclosure should not be construed as being limited to the drawings.

MODE FOR DISCLOSURE

Figure 1:
FIG. 1 is a diagram illustrating the internal structure of a cell and the type of short circuit.
Figure 2:
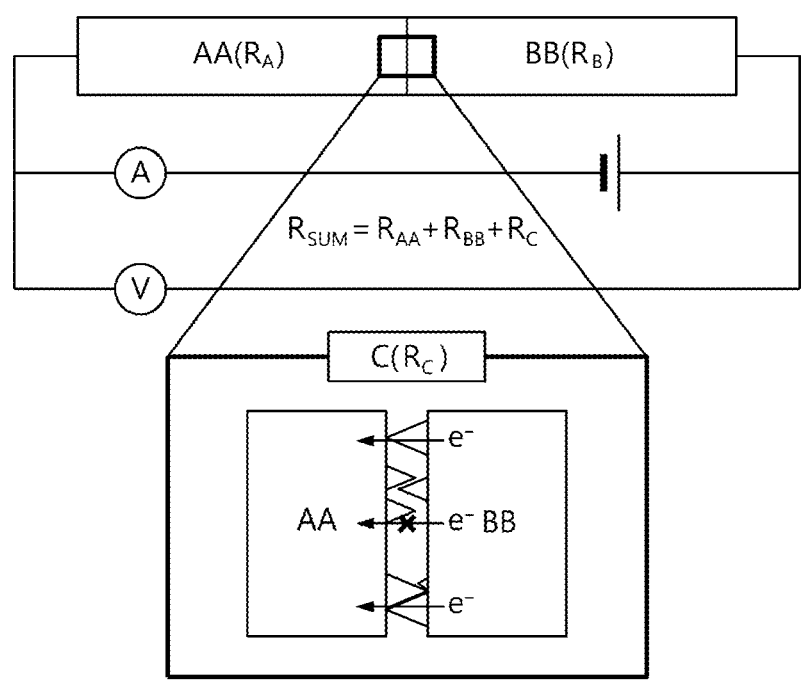
FIG. 2 is a diagram illustrating the definition and cause of contact resistance.

Hereinafter, the preferred embodiments of the present disclosure will be described in detail with reference to the accompanying drawings. However, the embodiments according to the present disclosure may be modified in many other forms, and the scope of the present disclosure should not be construed as limited to the following embodiments. The embodiments of the present disclosure are presented to provide a more complete description of the present disclosure to those having ordinary skill in the art.

The terms or words used in the specification and the appended claims should not be construed as limited to general and dictionary meanings, but interpreted based on the meanings and concepts corresponding to the technical aspects of the present disclosure on the basis of the principle that the inventor is allowed to define the terms appropriately for the best explanation.

Accordingly, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the patent application.

When a short circuit current occurs, heat is locally generated in a secondary battery and the heat spreads. It is safe if the generated heat is released out of the secondary battery well, but if an amount of generated heat is larger than an amount of released heat, the temperature of the secondary battery gradually increases, and thermal runaway may occur. The amount of heat generated at the time of the internal short circuit is determined by the cell resistance, the short circuit resistance and the cell voltage. The safety evaluation method and apparatus of the present disclosure can accurately measure the short circuit resistance. The present disclosure evaluates safety by accurately predicting a heat generation amount based on the accurate short circuit resistance.

Figure 4:
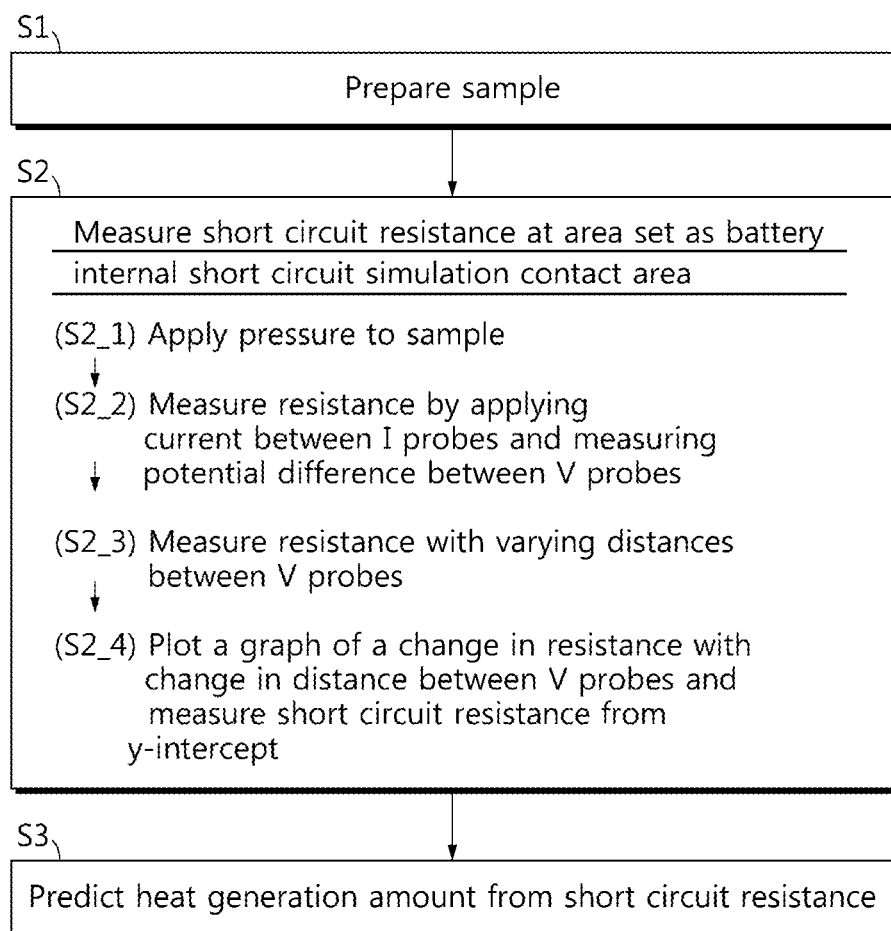
FIG. 4 is a flowchart of a safety evaluation method according to an embodiment of the present disclosure.

FIG. 4 is a flowchart of a safety evaluation method according to an embodiment of the present disclosure.

Referring to FIG. 4, first, a sample for secondary battery electrode evaluation is prepared (S1).

As described previously with reference to FIG. 1, there are a total of four types of cell internal short circuits including a short circuit $S_A$ between the positive electrode current collector and the negative electrode current collector, a short circuit $S_B$ between the positive electrode current collector and the negative electrode active material layer, a short circuit $S_C$ between the positive electrode active material layer and the negative electrode active material layer, and a short circuit $S_D$ between the positive electrode active material layer and the negative electrode current collector. The short circuit resistance which is resistance at each short circuit $S_A$, $S_B$, $S_C$, $S_D$ is of interest in the present disclosure. Accordingly, the sample in which these types of short circuits occur is prepared.

The sample is required to cause a short circuit by the contact between components included therein. Considering the four types of short circuits previously mentioned, the sample including a combination of any one of the positive electrode current collector and the positive electrode active material layer and any one of the negative electrode current collector and the negative electrode active material layer is prepared. For example, when it is necessary to measure the short circuit $S_A$ resistance between the positive electrode current collector and the negative electrode current collector, the sample is prepared by simply placing the positive electrode current collector, for example, an Al foil and the negative electrode current collector, for example, a Cu foil, one on another (indicated as 'positive electrode current collector/negative electrode current collector'). The sample may be prepared in a very simple form such as positive electrode current collector/negative electrode current collector, positive electrode current collector/negative electrode active material layer, positive electrode active material layer/negative electrode current collector or positive electrode active material layer/negative electrode active material layer. As opposed to the conventional post-evaluation method, there is no need to prepare a complete secondary battery sample, reducing the evaluation costs and the final secondary battery manufacturing costs accordingly.

Subsequently, short circuit resistance at an area of the sample set as a secondary battery internal short circuit simulation contact area is calculated (S2).

S2 may include the sub-steps S2_1~S2_4 as below.

First, a predetermined pressure sufficient to bring the components of the sample into contact is applied to the area (S2_1).

Under the applied pressure, the resistance of the sample is measured (S2_2). In particular, I probes for applying the current and V probes for measuring a potential difference are separately used. Two I probes and two V probes come into contact with the sample, the current is applied between I probes, a potential difference between the V probes is measured, and resistance is obtained by calculation of dividing the measured voltage by the applied current. The current does not flow in the V probes, and there is no resistance by the flow of current. This is not measuring a potential difference between I probes, and does not measure the resistance resulting from the I probes. Accordingly, it is possible to precisely measure a small resistance. Plotting a graph of current I-voltage V vs applied current, the straight line slope corresponds to resistance R, and the measured and calculated resistance is hereinafter referred to as $R_{measured}$.

When the resistance of the V probe wire is $R_{wire}$ and the short circuit resistance at the area is $R_{short\ circuit}$, $R_{measured}$ satisfies the following Equation 1.

$$R_{measured} = R_{wire} + R_{short\ circuit} \quad \text{[Equation 1]}$$

When d is the distance between V probes, Equation 1 may be expressed as the following Equation 2.

$$R_{measured} = (R_{wire\ per\ length}/d) + R_{short\ circuit} \quad \text{[Equation 2]}$$

In Equation 2, $R_{wire\ per\ length}$ is the V probe wire resistance per length. The wire resistance $R_{wire}$ between the V probes changes depending on the distance d, but the short circuit resistance $R_{short\ circuit}$ should be constant.

Subsequently, resistance is measured with varying distances between the V probes (S2_3). Each resistance at least different two distances is measured.

A graph of a change in resistance with a change in distance between V probes may be obtained using the results of S2_2 and S2_3 (S2_4).

Figure 5:
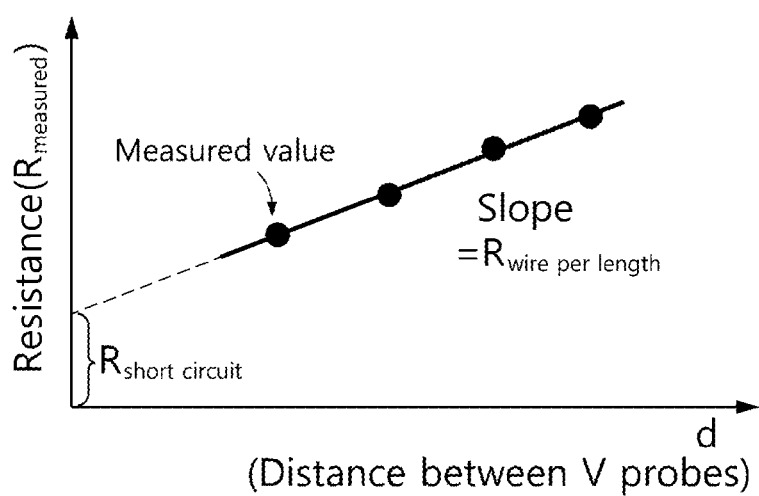
FIG. 5 shows an example of a graph of a change in resistance with a change in distance between V probes.

FIG. 5 is an example of a graph of a change in resistance with a change in distance between V probes. The graph may be obtained by plotting the resistance values obtained at each distance as points (data point), and when linear fitting is added to the graph through a method (extrapolation or interpolation may be used) that obtains a straight line passing through the points, the slope of the graph is $R_{wire\ per\ length}$ and the y-intercept is $R_{short\ circuit}$. Accordingly, the present disclosure is characterized in that it is possible to accurately determine the short circuit resistance $R_{short\ circuit}$ by separating the wire resistance component from the measured resistance $R_{measured}$.

Subsequently, a heat generation amount of the area is predicted from the short circuit resistance $R_{short\ circuit}$ calculated through the previous step S2 (S3).

The heat generated by the short circuit can be calculated according to the following Equation 3 when the short circuit resistance is known.

$$P_{watt} = I^2 \cdot R_e = V^2 \cdot R_e/(R_i + R_e)^2 \quad \text{[Equation 3]}$$

In Equation 3, $R_i$ is the cell resistance as the internal resistance. $R_e$ is the short circuit resistance as the external resistance. When V is the cell voltage and I is the current flowing in the short circuit, P is power, i.e., heat generated from the short circuit.

When the short circuit resistance obtained by measuring the resistance by the method of S2, followed by graph fitting, is the measured short circuit resistance $R_O$, the real short circuit resistance $R_a$ considering the short circuit area A may be calculated from the following Equation 4.

$$R_a = R_O/A \quad \text{[Equation 4]}$$

To calculate the real heat generation amount, the real short circuit resistance $R_a$ is substituted into $R_e$ of Equation 3.

The heat generation amount predicted through these steps is a heat generation amount under the predetermined pressure at the area of the sample set as the secondary battery internal short circuit simulation contact area. It is possible to evaluate safety of the secondary battery in various aspects using the heat generation amount.

For example, from the predicted result value of the heat generation amount, it is possible to determine if at least one item of the composition, the porosity, the thickness and the surface characteristics of the components causing the short circuit, is suitable. For example, as Test 1, a positive electrode current collector/negative electrode current collector sample is prepared to measure the short circuit resistance of the short circuit $S_A$ between the positive electrode current collector and the negative electrode current collector, the short circuit resistance is measured under a predetermined pressure P1, a heat generation amount is predicted, and when the heat generation amount is determined to be not large enough to cause thermal runaway in the secondary battery as a result of the prediction, the positive electrode current collector and the negative electrode current collector included in the measurement sample as the components are determined to be suitable for the current collector specification such as the material or the thickness. When the predicted heat generation amount is determined to be large enough to cause thermal runaway in the secondary battery, the positive electrode current collector and the negative electrode current collector included in the measurement sample as the components are unsuitable. Accordingly, it is determined that some design conditions such as the material or the thickness need to change.

The safety evaluation method according to the present disclosure may further include obtaining a graph of a change in short circuit resistance with a change in pressure and simulating the short circuit resistance with a change in internal pressure of the secondary battery including the components.

For example, even the secondary battery including the positive electrode current collector and the negative electrode current collector determined to be suitable in Test 1 may increase in the internal pressure up to P2 by various reasons while in use, and in this situation, it is necessary to predict an amount of heat generated by the short circuit. The conventional art does not consider it, but the safety evaluation method of the present disclosure is performed to conduct Test 2 to measure the short circuit resistance under the pressure P2 applied to the sample and predict a heat generation amount. When the heat generation amount obtained from P1 of Test 1 is not large enough to cause thermal runaway, while the heat generation amount obtained from P2 of Test 2 is determined to be large enough to cause thermal runaway, the positive electrode current collector and the negative electrode current collector included in the measurement sample as the components are unsuitable. According to the present disclosure, it is possible to predict an amount of heat generated by the internal pressure of the secondary battery in an environment in which the battery is actually used, thereby obtaining a more accurate safety evaluation result, and ensuring safety of the secondary battery while in real use.

Similar to this example, when a sample is suitably prepared, it is possible to accurately measure the short circuit resistance for each of the short circuit $S_B$ between the positive electrode current collector and the negative electrode active material layer, the short circuit $S_C$ between the positive electrode active material layer and the negative electrode active material layer, and the short circuit $S_D$ between the positive electrode active material layer and the negative electrode current collector under a predetermined pressure, and accordingly, accurately predict a heat generation amount.

For example, after the design conditions for the positive electrode current collector and the negative electrode current collector are established through the previous Test 1 and/or Test 2, a positive electrode current collector/negative electrode active material layer sample in which a short circuit $S_B$ between the positive electrode current collector and the negative electrode active material layer may occur is prepared as Test 3, and a short circuit resistance is measured and a heat generation amount is predicted. When this heat generation amount is determined to be large enough to cause thermal runaway in the secondary battery, the negative electrode active material layer included in measurement sample as the component is unsuitable. Thus, the results obtained with varying compositions of the negative electrode active material layer, for example, varying types or ratios of each of the active material, the conducting material and the binder, or varying porosities and thicknesses of the negative electrode active material layer, can be used in developing a more suitable negative electrode active material layer.

A variety of other safety evaluation applications not described herein can be contemplated in the battery design step, and the use of the accurate short circuit resistance obtained by the safety evaluation method of the present disclosure and the heat generation amount predicted therefrom fall within the scope of the present disclosure.

Meanwhile, the previously described safety evaluation method according to the present disclosure may be performed using a combination of each of means for applying a predetermined pressure to a sample, means for applying the current to the sample and measuring a potential difference, and means for calculating a short circuit resistance and a heat generation amount using the result values obtained by measurement. Here, each means may include any means that can be used on the technical level of those skilled in the art such as human or known electronic mechanical device components, and the safety evaluation method of the present disclosure may be performed by appropriate combinations thereof.

Hereinafter, a safety evaluation apparatus according to the present disclosure suitable to implement the safety evaluation method will be described.

Figure 6:
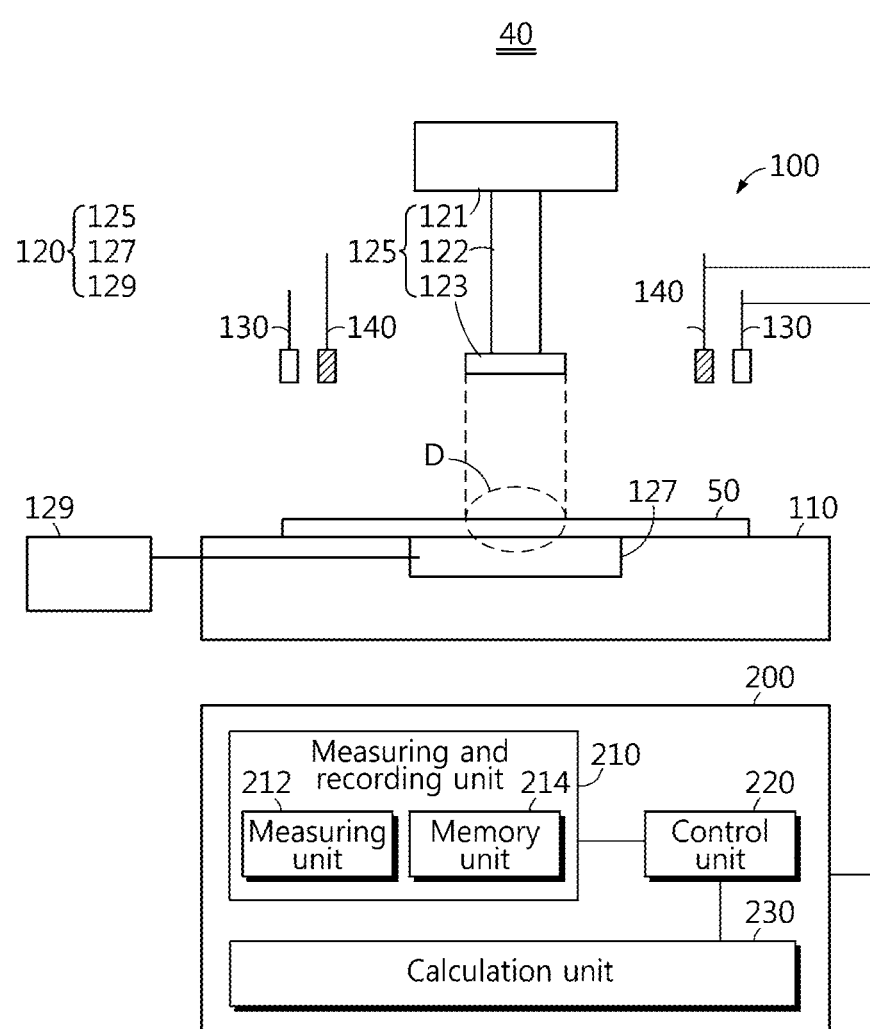
FIG. 6 is a schematic diagram of a safety evaluation apparatus according to an embodiment of the present disclosure.

FIG. 6 is a schematic diagram of a safety evaluation apparatus according to an embodiment of the present disclosure.

Referring to FIG. 6, the safety evaluation apparatus 40 includes a jig unit 100 for measuring short circuit resistance and a system unit 200 for measurement and calculation.

The jig unit 100 includes a mount 110 where a sample 50 for secondary battery electrode evaluation in which a short circuit may occur by contact between components is placed, a pressure applying unit 120 provided to apply a predetermined pressure to an area of the sample 50 set as a secondary battery internal short circuit simulation contact area D to bring the components into contact, I probes 130 provided to come into contact with the sample 50, and V probes 140 that are separate from the I probes 130 and have an adjustable distance between probes.

The pressure applying unit 120 basically includes a press unit 125, and may further include a load cell 127 and an indicator 129. The press unit 125 may include an up-down press 122 that operates by a driving unit 121 and a press jig 123 that can be replaced with another press jig of a right size for the area D. The load cell 127 may convert the load that the press unit 125 applies to the sample 50 to an electrical signal and display it through the indicator 129. The load cell 127 may be included in the press unit 125, and may be placed on or included in the mount 110.

The system unit 200 is connected to the I probes 130 and the V probes 140 of the jig unit 100. The system unit 200 includes a measuring and recording unit 210, a control unit 220 and a calculation unit 230.

The measuring and recording unit 210 applies the current between the I probes 130, and measures and records a potential difference between the V probes 140. The measuring and recording unit 210 may include at least a measuring unit 212 and a memory unit 214.

The control unit 220 may be electrically coupled to the measuring unit 212.

The measuring unit 212 includes a circuit necessary to apply the current between the I probes 130 and measure a potential difference between the V probes 140 under the control of the control unit 220, and outputs the measured result values to the control unit 220. The control unit 220 stores the inputted result values in the memory unit 214.

The memory unit 214 is a storing medium capable of recording or erasing data electrically, magnetically, optically or quantum-mechanically, and as a non-limiting example, may be RAM, ROM or register. Preferably, the memory unit 214 may be connected to the control unit 220, for example, through a data bus, to allow the control unit 220 to access it.

The memory unit 214 may store and/or update and/or erase programs including various types of control logics executed by the control unit 220, predefined parameters and/or data created when the control logics are executed. The memory unit 214 may be logically split into two or more, and may be included in the control unit 220, but is not limited thereto.

The calculation unit 230 may read the result values from the memory unit 214, calculate resistance, and obtain a graph of a change in resistance with a change in distance between the V probes 140. According to the previously described method, the calculation unit 230 may be programmed to perform a variety of necessary computations including calculating a short circuit resistance of the area D from the y-intercept of the graph, and predicting a heat generation amount of the area from the short circuit resistance.

The control unit 220 may selectively include a processor, an Application-Specific Integrated Circuit (ASIC), a chipset, a logic circuit, a register, a communication modem and a data processing device known in the art to execute various control logics disclosed herein. Additionally, when the control logic is implemented in software, the control unit 220 may be implemented as a set of program modules. In this instance, the program module may be stored in the memory unit 214 and executed by the processor. The memory unit 214 may be inside or outside of the processor, and may be connected to the processor with a variety of well-known means.

Meanwhile, the system unit 200 may include electrochemical impedance spectroscopy (EIS). The electrochemical impedance spectroscopy 230 helps the measuring and recording unit 210 and the calculation unit 230 to easily measure and monitor the resistance and calculate the short circuit resistance. The electrochemical impedance spectroscopy may include the measuring and recording unit 210 and the calculation unit 230.

In using the safety evaluation apparatus 40, the sample 50 may be placed on the mount 110, and S1 and S2_1 of FIG. 4 previously described may be performed through the pressure applying unit 120.

The up-down press 122 is lifted down by the operation of the driving unit 121 so that the press jig 123 comes into contact with the sample 50, and the pressure is applied by adjusting the load. It is possible to monitor if desired pressure is being applied while seeing the values displayed through the load cell 127 and the indicator 129. The driving unit 121 may be a passive press that is manipulated manually by a lever or screw, but the driving unit 121 may be constructed as an electrically driven press that automatically operates in line with the system unit 200 through a signal for operating the control unit 220 within the system unit 200.

Under the applied pressure, when the I probes 130 and the V probes 140 come into contact with the sample 50 and are connected to the system unit 200, S2_2 and S2_3 of FIG. 4 may be performed through the measuring and recording unit 210. The calculation unit 230 calculates resistance using the measured results by the measuring and recording unit 210. To perform S2_3, the step of changing the distance between the V probes 140 may be performed manually or automatically according to the design of the apparatus itself, for example, by the operation of the control unit 220.

Subsequently, the calculation unit 230 obtains a graph of a change in resistance with a change in distance between the V probes 140, calculates a short circuit resistance of the area D from the y-intercept of the graph, and performs S2_4 of FIG. 4. Additionally, a heat generation amount of the area D is predicted from the short circuit resistance, and S3 of FIG. 4 is performed.

Figure 7:
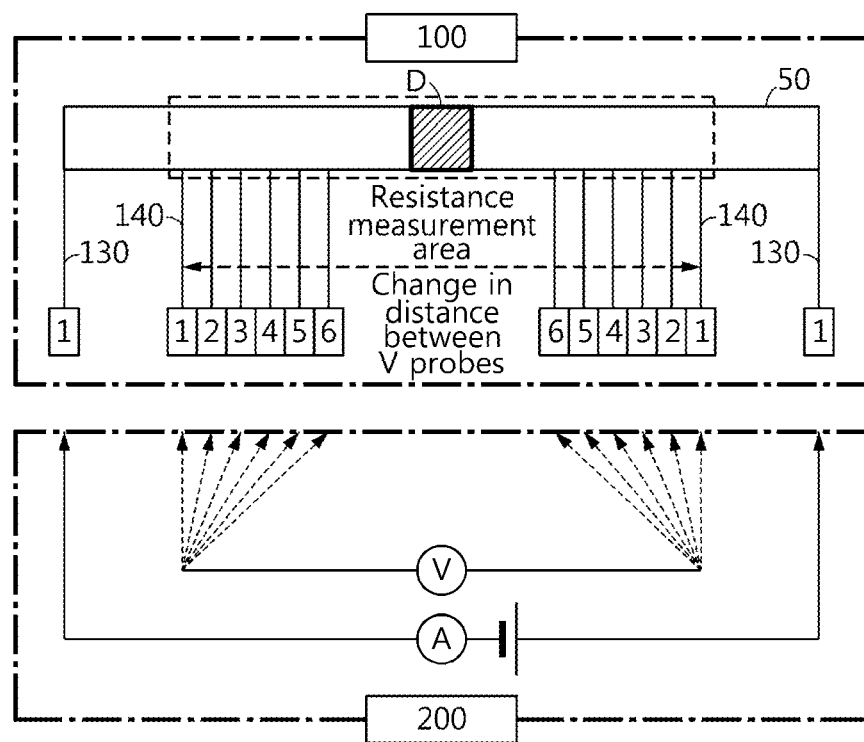
FIG. 7 shows a preferable example of I probes and V probes included in the safety evaluation apparatus of FIG. 6.

FIG. 7 shows a preferred example of the I probes 130 and the V probes 140 as the components included in the safety evaluation apparatus 40 of FIG. 6. FIG. 7 includes an illustration of the connection relationship between the I probes 130 and the V probes 140, and the system unit 200.

Two I probes 130 and four or more V probes 140 are provided, for example, twelve V probes 140 are provided as shown.

The V probes 140 are arranged between the two I probes 130. The V probes 140 are arranged at a regular distance on two sides of the secondary battery internal short circuit simulation area D of the sample 50. The serial numbers of 1 to 6 are allocated in the order from the outermost V probes 140 to the innermost V probes 140, and in the primary measurement for S2_2 of FIG. 4, the current is applied between the I probes 130, and for example, resistance is obtained by measuring a potential difference between No. 6 V probes 140. Subsequently, in the secondary measurement for S2_3 of FIG. 4, the position of the I probes 130 is invariable and the current is applied therebetween, and for example, resistance is obtained by measuring a potential difference between No. 5 V probes 140. As described above, the position of each V probe 140 is invariable, while the position of the V probes 140 used to read the potential difference is variable. By this manipulation, the distance between V probes for resistance measurement may be increased. On the contrary, the distance may be reduced.

In the configuration of FIG. 7, it is possible to change the distance between V probes by selecting any two of many V probes 140 and using them in combination. Which two of many V probes 140 to use may be a selection criterion for a desired distance variation, and the selection and use may be accomplished mechanically or by a signal command of the control unit 220.

As described above, the safety evaluation apparatus 40 of the present disclosure may precisely measure the short circuit resistance for each internal short circuit case as a function of the pressure, considering the likelihood that the internal short circuit may occur in the secondary battery. The I probes and the V probes are separately used to precisely measure a small resistance. After measuring resistance with fixed I probes and varying distances between V probes, linear fitting may be added to a graph of resistance vs distance between V probes to extract the probe wire resistance, obtaining a more accurate short circuit resistance.

Hereinafter, after the safety evaluation apparatus is manufactured in a simplified form for test, examples of applications used in real short circuit resistance measurement using positive and negative electrodes designed for a 4.2V secondary battery will be described.

Figure 8:
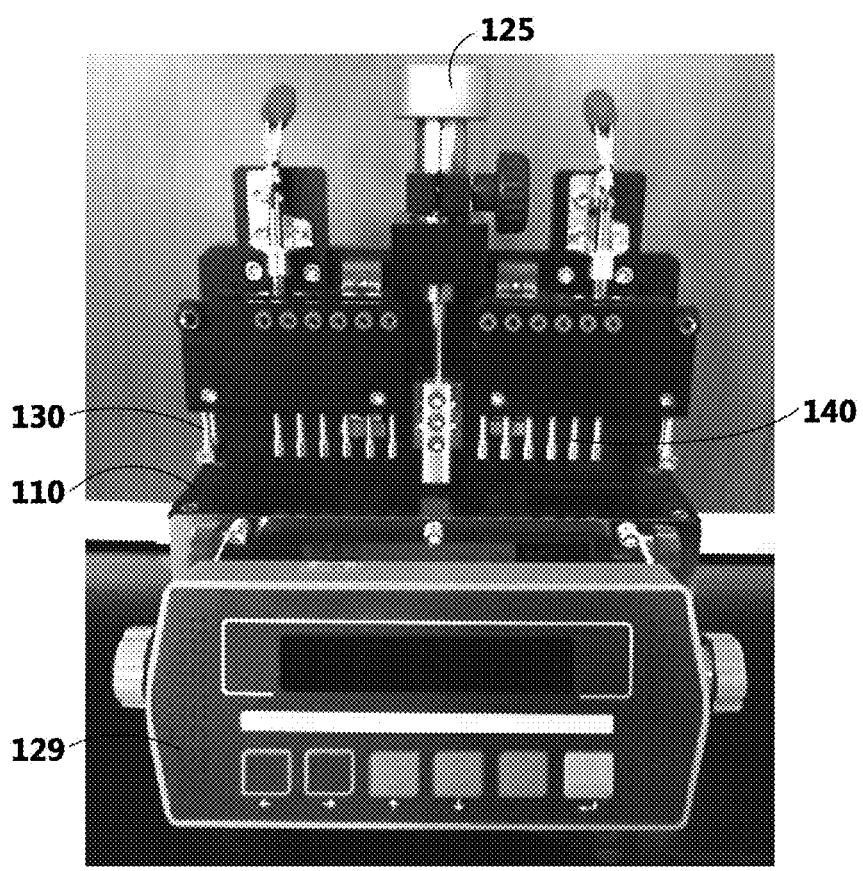
FIG. 8 is a photographic image of a jig unit of a safety evaluation apparatus for test manufactured according to the present disclosure.

FIG. 8 is a photographic image of the jig unit of the safety evaluation apparatus manufactured for test according to the present disclosure.

Referring to FIG. 8, the mount 110, the press unit 125, the indicator 129, the I probes 130 and the V probes 140 are shown. A commercial EIS may be connected to the jig unit to replace the system unit.

For the indicator 129, CAS CI-2001A model is used. The CAS CI-2001A model is an industrial small-sized indicator suitable for measurement testing and platform scale.

The specification of the simplified jig unit and the EIS used in the test is as shown in the following Tables 1 and 2.

TABLE 1

| Item | Details |
| --- | --- |
| Pressure applied | 0~30 Kgf/cm$^2$ |
| Measurement area | 1 cm$^2$ |
| Number of probes | 2 I probes, 12 V probes |
| Distance between probes | V probe - V probe: 1 cm |
| | V probe - I probe: 3 cm |
| Measurement length | 3.5, 5.5, 7.5, 9.5, 11.5, 13.5 cm |
| Sample size | Width: 1 cm, Length: 11 cm or more |
| Sample type | Current collector and active material layer |

TABLE 2

| Item | Details |
| --- | --- |
| EIS connection | 4 pi, 2 pi Banana plug |
| EIS measurement | LSV (0~30 mV) |
| EIS Booster | 5 A, 10 A |

Figure 9:
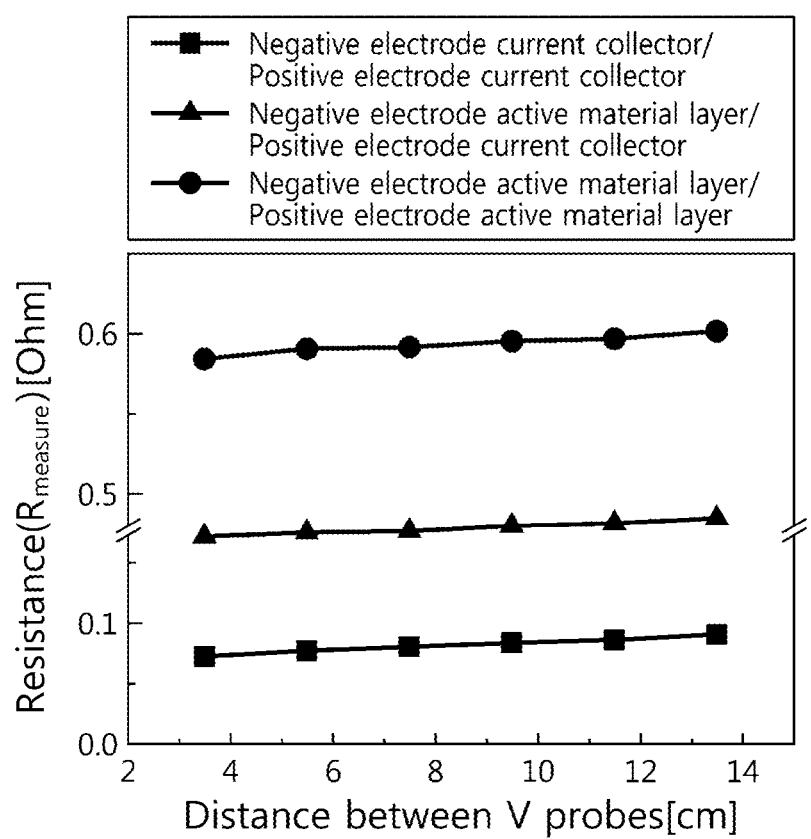
FIG. 9 is a graph showing resistance $R_{measured}$ with a change in distance for each short circuit type, measured with a safety evaluation apparatus for test.

FIG. 9 is a graph showing resistance $R_{measured}$ with a change in distance for each short circuit type, measured with the safety evaluation apparatus for test.

It can be seen that as the distance increases with the increasing distance between V probes, the measured resistance linearly increases. It corresponds to the expected resistance change tendency based on the distance, showing reliable results.

Figure 10:
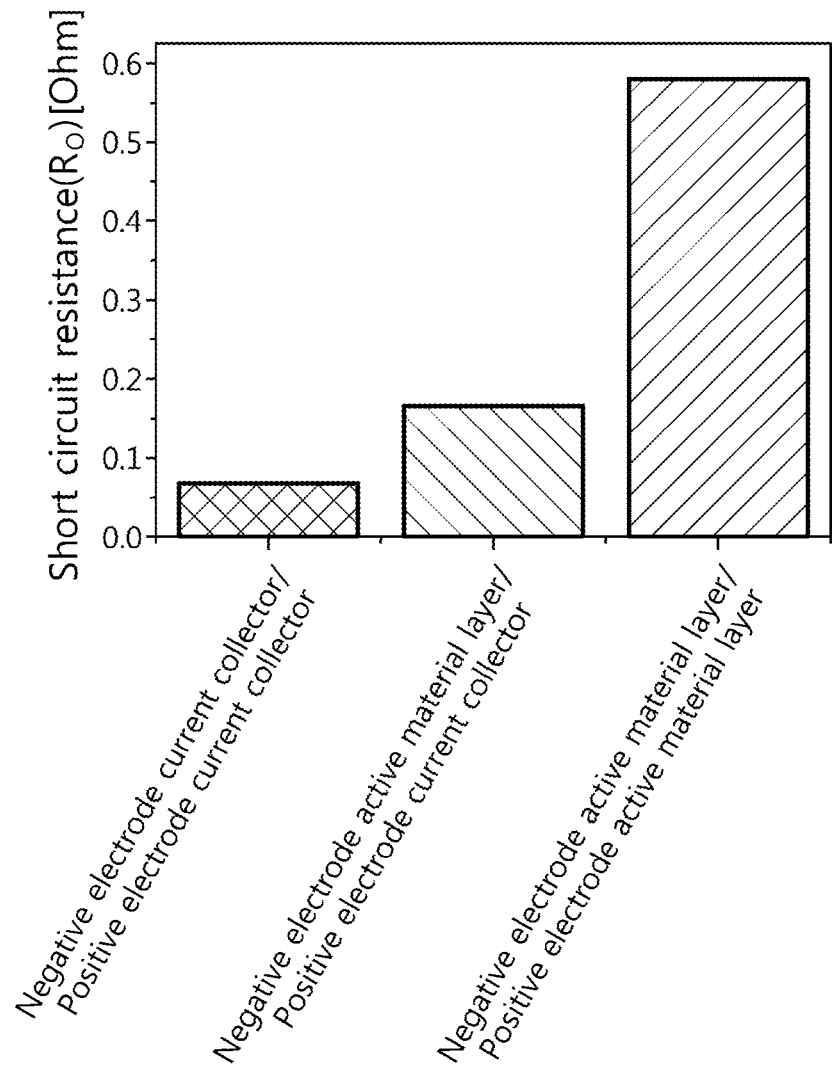
FIG. 10 is a graph showing a comparison of short circuit resistance $R_O$ for each short circuit type, measured with a safety evaluation apparatus for test.

FIG. 10 is a graph showing a comparison of short circuit resistance $R_0$ for each short circuit type, measured with the safety evaluation apparatus for test. The applied pressure is 10 Kgf/cm$^2$.

According to the characteristics of the material, the short circuit resistance increases in the order of the negative electrode current collector/positive electrode current collector, the negative electrode active material layer/positive electrode current collector, and the negative electrode active material layer/positive electrode active material layer. The measurement results match this. Because even a small resistance difference can be stably measured irrespective of the type, it is possible to distinguish the resistance according to the type of short circuit, that is, it is possible to achieve stable measurement.

It can be seen from FIGS. 9 and 10 that the resistance and the short circuit resistance can be stably measured with high reliability irrespectively of the type of short circuit.

Figure 11:
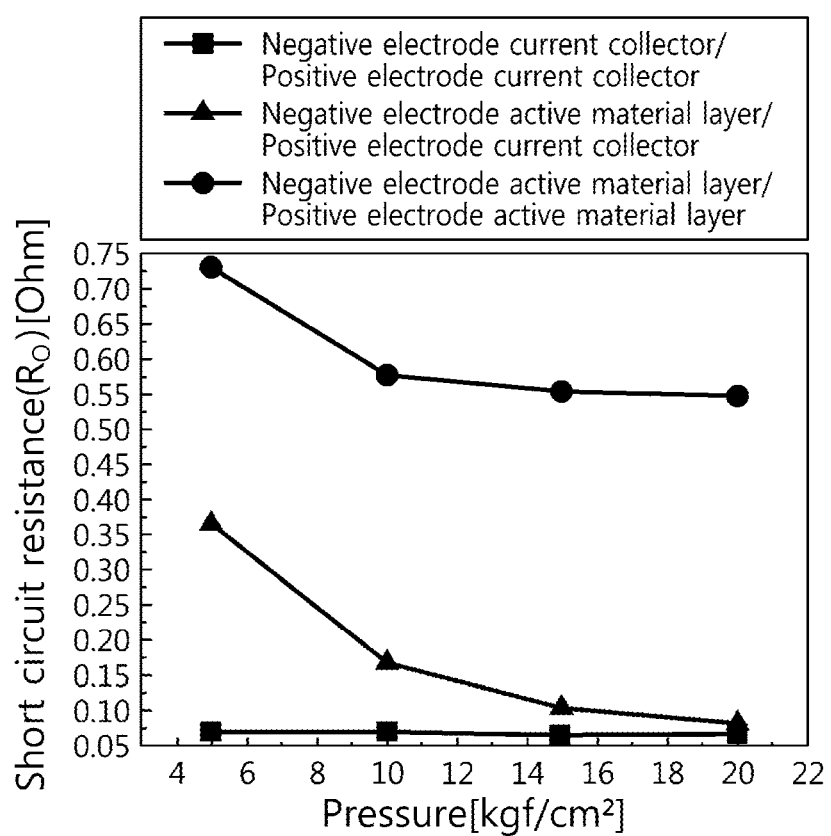
FIG. 11 is a graph showing short circuit resistance $R_O$ with a change in pressure, measured with a safety evaluation apparatus for test.

FIG. 11 is a graph showing the short circuit resistance $R_0$ with a change in pressure, measured with the safety evaluation apparatus for test.

Figure 3:
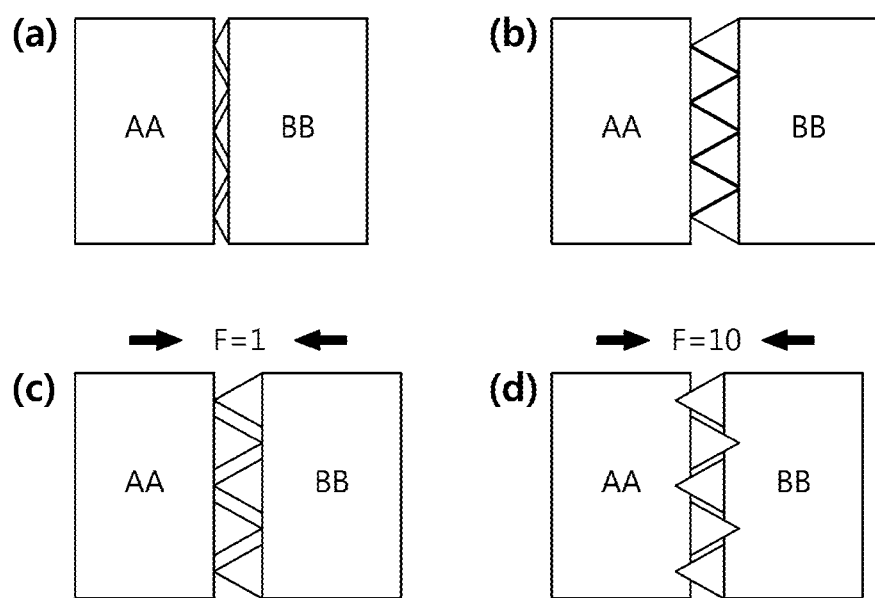
FIG. 3 is a diagram illustrating difficulty in measuring contact resistance.

Referring to FIG. 11, there is a tendency to converge to a specific value as the pressure increases. As described with reference to FIG. 3, as the pressure increases, the contact resistance decreases. The results of FIG. 11 show a change in resistance with the increasing resistance movement path as the pressure increases. Accordingly, it is found that reliable measurement results can be obtained. Additionally, the short circuit resistance reduction with the increasing pressure shows that even a small resistance change caused by a difference in pressure can be stably measured. Accordingly, it can be seen from FIG. 11 that the short circuit resistance can be stably measured with high reliability irrespective of a change in pressure.

Figure 12:
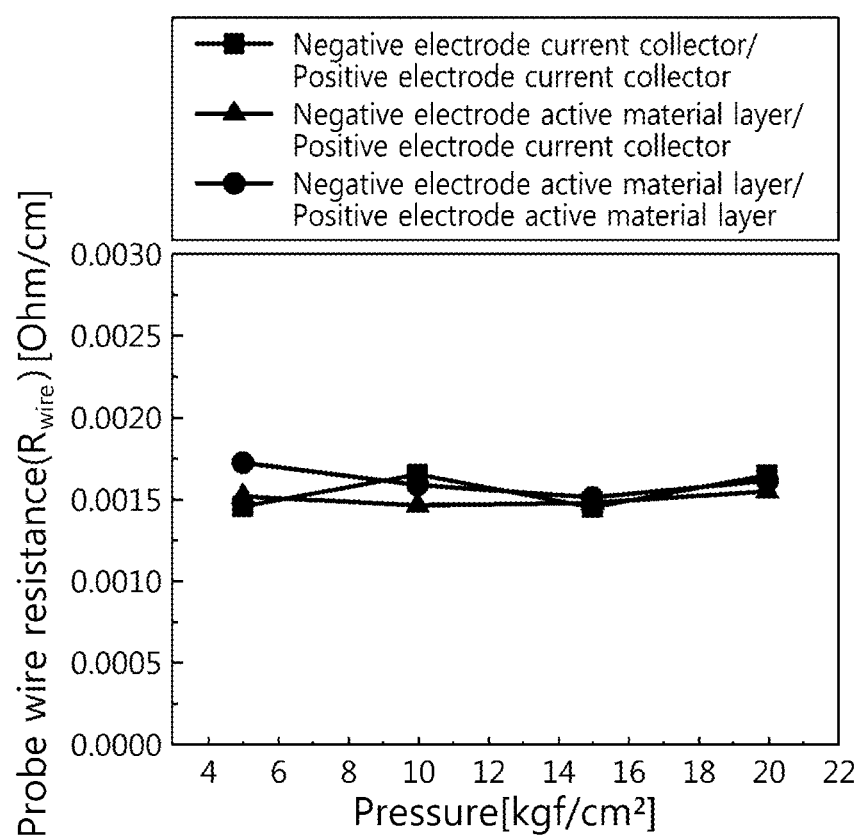
FIG. 12 is a graph of probe wire resistance $R_{wire}$ with a change in pressure, measured using a safety evaluation apparatus for test.

FIG. 12 is a graph of the probe wire resistance $R_{wire}$ with a change in pressure, measured with the safety evaluation apparatus for test.

Referring to FIG. 12, the resistance is nearly equal for each type, and there is no change depending on the pressure. The probe wire resistance should be constant for each type and each pressure as mentioned above in Equation 3. It is because the resistance of the material itself is constant irrespective of the pressing pressure. The measurement results match this. Accordingly, it can be seen through FIG. 12 that it is possible to achieve reliable measurement irrespective to a change in pressure.

The heat generation amount may be calculated by converting the short circuit resistance $R_O$ of FIG. 10 to the real short circuit resistance considering the short circuit area according to Equation 4, and substituting it into $R_e$ of Equation 3.

Figure 13:
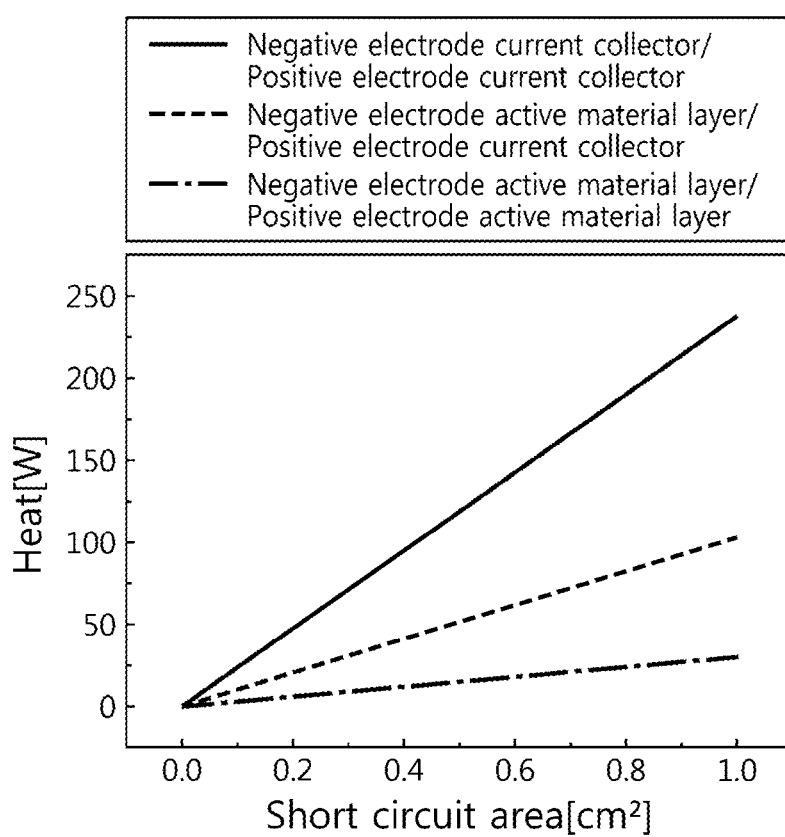
FIG. 13 is a graph showing a heat generation amount calculated from the short circuit resistance $R_O$ of FIG. 10 as a function of short circuit area.

FIG. 13 is a graph showing the heat generation amount calculated from the short circuit resistance $R_O$ of FIG. 10 as a function of short circuit area. In the 4.2V secondary battery, the cell resistance is low as much as 3 mΩ. Because the cell resistance is low, it is expected that the heat increases with the increasing short circuit area, and the corresponding results can be obtained.

As described hereinabove, the safety evaluation method of the present disclosure is characterized by accurately measuring the short circuit resistance used as one of safety evaluation items in the battery design step before battery assembly and the electrode assembly step, where the short circuit resistance including the contact resistance between components that have caused a short circuit is measured for accurate measurement.

According to the safety evaluation method of the present disclosure, the short circuit resistance may be accurately measured by simulation of an internal short circuit situation of the secondary battery, a heat generation amount at the time of internal short circuit may be predicted, and through this, substantial safety evaluation for the active material and the composition of the electrode and the battery design may be performed as pre-evaluation before battery assembly. When safety evaluation is finished before battery assembly, it is possible to verify and modify new design standards. It is possible to immediately change the design condition of the secondary battery after evaluation, and can be used as an evaluation means useful in the research and development stage. Accordingly, the safety evaluation method of the present disclosure is pre-evaluation, not post-evaluation such as compression test, collision test, penetration test and heat exposure (heating) test, and can provide very accurate and useful safety evaluation means.

According to the safety evaluation method of the present disclosure, it is possible to evaluate safety using the sample for secondary battery electrode evaluation including a combination of any one of the positive electrode current collector and the positive electrode active material layer and any one of the negative electrode current collector and the negative electrode active material layer. As opposed to the conventional post-evaluation method, there is no need to prepare a complete secondary battery sample, reducing the evaluation costs and the final secondary battery manufacturing costs accordingly.

According to the safety evaluation apparatus of the present disclosure, it is possible to achieve precise measurement by separately using I probes for applying the current and V probes for measuring a potential difference, and measure an accurate short circuit resistance by obtaining a graph of a change in resistance with a change in distance between V probes and eliminating the resistance component of the probe wire.

Additionally, according to the safety evaluation apparatus of the present disclosure, the pressure applying unit including the load cell and the indicator is provided to measure the short circuit resistance by applying, to the sample, a specific pressure that is equal to the pressure at the time of the real internal short circuit of the secondary battery. Accordingly, it can be used as safety evaluation means under a more accurate and realistic internal short circuit simulation environment.

According to the safety evaluation apparatus of the present disclosure, it is possible to measure the pressure and the short circuit resistance and predict a heat generation amount at the same time using one apparatus, thereby enhancing the time efficiency and improving the test operation efficiency.

In describing various embodiments of the present disclosure, components designated by '~unit' should be understood as elements which are classified functionally rather than physically. Accordingly, each component may be selectively combined with other component, or may be divided into subcomponents for efficient execution of control logic(s). However, it is obvious to those skilled in the art that even though the components are combined or divided, if the sameness of functions can be acknowledged, the combined or divided components should be construed as being in the scope of the present disclosure.

While the present disclosure has been hereinabove described with regard to a limited number of embodiments and drawings, the present disclosure is not limited thereto and various modifications and changes may be made by those skilled in the art within the technical aspects of the present disclosure and the equivalent scope of the appended claims.

What is claimed is:

1. A safety evaluation method comprising:
   preparing a sample for secondary battery electrode evaluation in which a short circuit occurs when components included in the sample contact each other;
   applying a predetermined pressure which causes the contact between the components to an area of the sample set as a secondary battery internal short circuit simulation contact area;
   applying a current between I probes in contact with the sample, obtaining resistance by measuring a potential difference between V probes which are separate from the I probes, obtaining a graph of a change in resistance with a change in distance between the V probes, and calculating a short circuit resistance of the area from y-intercept of the graph; and
   predicting a heat generation amount of the area from the short circuit resistance;
   obtaining a graph of a change in the short circuit resistance with a change in pressure, and performing a simulation of the short circuit resistance with a change in internal pressure of a secondary battery including the components.

2. The safety evaluation method according to claim 1, further comprising:
   determining that at least one item selected from the group consisting of composition, porosity, thickness and surface characteristic of the component is suitable based on a predicted result value of the heat generation amount.

3. A safety evaluation apparatus comprising:
   a jig unit for measuring a short circuit resistance, and a system unit for measurement and calculation,
   wherein
   the jig unit comprises:
      a mount on which a sample for secondary battery electrode evaluation is placed, wherein a short circuit will occur is caused by contact between components included in the sample;
      a pressure applying unit configured to apply a predetermined pressure that causes the contact between the components to an area of the sample set as a secondary battery internal short circuit simulation contact area;
      I probes which contact with the sample; and
      V probes which are separate from the I probes and have an adjustable distance from the V probes, and
   the system unit comprises:
      a measuring and recording unit configured to apply a current between the I probes and to measure and record a potential difference between the V probes;
      a control unit; and
      a calculation unit configured to obtain a graph of a change in resistance with a change in distance between the V probes, to calculate a short circuit resistance of the area from y-intercept of the graph, and to predict a heat generation amount of the area from the short circuit resistance.

4. The safety evaluation apparatus according to claim 3, wherein the V probes include a plurality of V probes arranged at regular intervals, and where any two of the V probes are selected and used in combination to change the distance between the V probes.

5. The safety evaluation apparatus according to claim 3, wherein the pressure applying unit comprises a press unit, a load cell and an indicator.

6. The safety evaluation apparatus according to claim 5, wherein the press unit includes an up-down press operated by a driving unit and a replaceable press jig.

7. The safety evaluation apparatus according to claim 3, wherein the system unit comprises electrochemical impedance spectroscopy (EIS).

* * * * *